US008804386B2

(12) United States Patent
Chevalier

(10) Patent No.: US 8,804,386 B2
(45) Date of Patent: Aug. 12, 2014

(54) CHARGE PUMP CIRCUIT WITH PULSE-WIDTH MODULATION

(75) Inventor: Laurent Chevalier, Grenoble (FR)

(73) Assignee: ST-Ericsson SA, Plan-les-Ouates (CH)

(*) Notice: Subject to any disclaimer, the term of this patent is extended or adjusted under 35 U.S.C. 154(b) by 273 days.

(21) Appl. No.: 13/388,516

(22) PCT Filed: Aug. 3, 2010

(86) PCT No.: PCT/EP2010/061284
§ 371 (c)(1),
(2), (4) Date: Feb. 2, 2012

(87) PCT Pub. No.: WO2011/015578
PCT Pub. Date: Feb. 10, 2011

(65) Prior Publication Data
US 2012/0126778 A1  May 24, 2012

(30) Foreign Application Priority Data

Aug. 4, 2009  (FR) ...................... 09 55470

(51) Int. Cl.
H02M 3/07 (2006.01)
(52) U.S. Cl.
USPC ............................................. 363/63; 363/59
(58) Field of Classification Search
CPC ............ H02M 2001/0032; H02M 2001/0035; H02M 2001/0048; H02M 2001/0054; H02M 3/07

USPC .......................... 363/59–60, 62–63; 327/536
See application file for complete search history.

(56) References Cited

U.S. PATENT DOCUMENTS

| 6,657,875 | B1* | 12/2003 | Zeng et al. ...................... 363/59 |
| 8,144,143 | B2* | 3/2012 | Huang et al. .................. 345/211 |
| 2002/0057082 | A1* | 5/2002 | Hwang ......................... 323/284 |
| 2002/0105312 | A1 | 8/2002 | Knight | |
| 2007/0013434 | A1 | 1/2007 | Peschke | |

FOREIGN PATENT DOCUMENTS

EP  0 862 260 A2  9/1998

OTHER PUBLICATIONS

International Search Report issued in corresponding International Application No. PCT/EP2010/061284, mailed Nov. 3, 2010, 2 pages.
Written Opinion issued in corresponding International Application No. PCT/EP2010/061284, mailed Nov. 3, 2010, 4 pages.

* cited by examiner

Primary Examiner — Harry Behm
(74) Attorney, Agent, or Firm — Patent Portfolios Builders PLLC

(57) ABSTRACT

Each switching element of a charge pump circuit of a voltage regulator comprises a relatively small-sized MOS transistor associated with a relatively large-sized MOS transistor connected in parallel. Only the small transistors are switched in a first mode of operation, while the large transistors are switched in a second mode of operation. In this manner the switching losses in the first mode of operation can be decreased.

7 Claims, 6 Drawing Sheets

CHARGE PUMP CIRCUIT WITH PULSE-WIDTH MODULATION

TECHNICAL FIELD

This invention relates in general to low drop-out voltage regulators, and more particularly to a charge pump circuit with pulse-width modulation comprised in such a regulator.

The invention has particular applications in the integrated circuits equipping electronic devices such as mobile telephones. For example, the charge pump circuit can be used to regulate the supply voltage of an audio amplifier comprised in such a device.

TECHNOLOGICAL BACKGROUND

In the applications considered, the power source of the device may comprise a rechargeable battery which can be recharged using a charger providing charging voltage from the power grid. The supply voltage available ranges from about 4.8 V when the voltage is provided by the charger, to about 2.3 V which corresponds to the minimum charging voltage of the battery (below which proper operation can no longer be assured). The voltage supplied by the fully charged battery is about 3.6 V.

In audio applications, the output current that the regulator must provide is typically between 10 and 20 mA, depending on the listening volume and the intensity of the sound to be reproduced. This range of values corresponds to listening at about two-thirds of the maximum power. However, to allow listening at a higher volume and/or to support peak power draw, the regulator must be able to deliver an output current on the order of 120 to 130 mA.

The voltage supplied by the battery may be low when the battery charge is low, for example after prolonged use. Battery voltage can also be affected by temperature, as the supply voltage it delivers is lower when the temperature is lower.

The resistivity of the MOS (Metal Oxyde Semiconductor) transistors used in the regulator is also highly dependent on temperature.

Depending on the specifications to be met in the type of applications considered, the voltage regulator of the device must be able to deliver the reference voltage even if the load consumes a high amount of current, for example 120 to 130 mA, and even when the supply voltage delivered by the battery falls to the minimum value of about 2.3 V.

In order to ensure compliance with these specifications, the voltage regulator can comprise a charge pump circuit in which the switches are typically realized with power MOS transistors. To maintain a stable output voltage in spite of a high output current and a low supply voltage, the resistivity of the MOS transistors must be as low as possible. This is why the MOS transistors are large in size. Typically, their gate width is about 0.5 µm, and their gate length is about 56 mm for a PMOS transistor or about 28 mm for an NMOS transistor. Their gate is typically folded with multiple fingers on the silicon substrate. For brevity, such transistors are called "large transistors" in the following description.

However, the parasitic gate-source capacitance of such transistors is high, and the charge pump circuit therefore has significant switching loss. This affects the power consumption of the circuit. In fact, the power dissipated because of this switching loss, denoted below as P, is expressed by the following relation:

$$P = C_{gs} \times F \times V^2 \quad (1)$$

where $C_{gs}$ indicates the gate-source capacitance;
F indicates the switching frequency; and,
V indicates the supply voltage of the MOS transistor.

To reduce switching loss, one can use the "pulse skipping" technique borrowed from the domain of DC-DC converters. This technique consists of reducing the switching frequency by skipping pulses of the control signal for the charge pump switches when an error signal, corresponding to the difference between the output voltage from the regulator and a reference voltage, exceeds a given threshold. This technique, however, only applies for very low values of current absorbed by the load.

FIG. 1 shows a graph of the operating region in which pulses can be skipped in this manner, inside the operating range 11 of the voltage regulator defined by the value of the supply voltage Vdd and the value of the output current Iout. The current Iout is the current delivered by the voltage regulator, meaning the current absorbed by the load. In general, the voltage regulator operates for values of Vdd of between 2.3 V and 4.8 V and values of Iout which can reach several hundred milliamps. Within this range 11, one can see that pulse skipping can be performed for values of the current Iout that are on the order of several milliamps only, with these values growing lower as the value of Vdd falls. Typically, pulse skipping can only be considered for a value of Iout of about 1 mA when Vdd is equal to 2.3 V, or for a value of Iout of about 3 mA when Vdd is equal to 4.8 V.

SUMMARY OF THE INVENTION

A need therefore exists for a technique to limit switching loss in a charge pump circuit.

This is why a first aspect of the invention proposes a voltage regulator circuit comprising a charge pump circuit with pulse width control and having:
an output for delivering an output voltage to a load;
a flying capacitor;
a charge storage capacitor coupled in parallel to the output;
a control logic; and,
switching elements arranged and controlled by the control logic to charge the flying capacitor in a first phase of operation, and to transfer the electrical charges stored in the flying capacitor to the charge storage capacitor in a second phase of operation.
In this regulator:
each switching element comprises a relatively small-sized MOS transistor associated with a relatively large-sized MOS transistor, connected in parallel and controlled separately; and,
only the relatively small-sized transistors are switched in a first mode of operation, while the relatively large-sized transistors are switched in a second mode of operation.

When the current absorbed by the load is low, small-sized MOS transistors can be used which lead to less switching loss, while when the output current is high the large MOS transistors can be used which are able to provide the necessary power.

In one embodiment, the regulator additionally comprises:
an error signal generator generating an error signal corresponding to the difference between the output voltage from the regulator and a reference voltage;
a sawtooth wave signal generator generating a sawtooth wave signal; and,
a pulse width modulator comparing the error signal and the sawtooth wave signal, and generating switching signals for the switching elements.

The control logic is configured to cause the regulator to pass from the first mode of operation into the second mode of operation when the error signal is less than a minimum value for the sawtooth wave signal.

The passage from the first to the second mode of operation is therefore automatic without requiring additional means in comparison to a conventional regulator. More particularly, the system is completely automatic in the sense that it requires no external command to pass from the operation of small MOS to large MOS, and vice versa. The system automatically adapts the mode of operation in particular as a function of:

the supply voltage;
the current supplied to the load (audio amp); and
the temperature.

In one embodiment, the control logic is additionally configured to implement a pulse skipping functionality applied to the switching signals when the error signal is greater than a maximum value of the sawtooth wave signal.

This maintains the advantages presented above for this functionality.

In one embodiment, the small-sized MOS transistors are respectively integrated with the large-sized MOS transistors with which they are associated, and in the second mode of operation, the large-sized MOS transistors are switched simultaneously with the small-sized MOS transistors with which they are respectively associated.

The silicon surface area occupied by the regulator is therefore not significantly increased in comparison to that of a conventional regulator.

In a second aspect, the invention also concerns an electronic device comprising a voltage regulator according to the first aspect.

In a third aspect, the invention also proposes a voltage regulation process using a charge pump circuit with pulse width control and having:

an output for delivering an output voltage to a load;
a flying capacitor;
a charge storage capacitor coupled in parallel to the output;
a control logic; and,
switching elements arranged and controlled by the control logic to charge the flying capacitor in a first phase of operation, and to transfer the electrical charges stored in the flying capacitor to the charge storage capacitor in a second phase of operation, wherein, each switching element comprising a relatively small-sized MOS transistor associated with a relatively large-sized MOS transistor, connected in parallel and connected separately, only the relatively small-sized transistors are switched in a first mode of operation, while the relatively large-sized transistors are switched in a second mode of operation.

BRIEF DESCRIPTION OF DRAWINGS

Other features and advantages of the invention will be apparent from reading the following detailed description. This description is purely illustrative and is to be read with reference to the attached drawings, which represent.

DETAILED DESCRIPTION OF EMBODIMENTS

Figure 2:
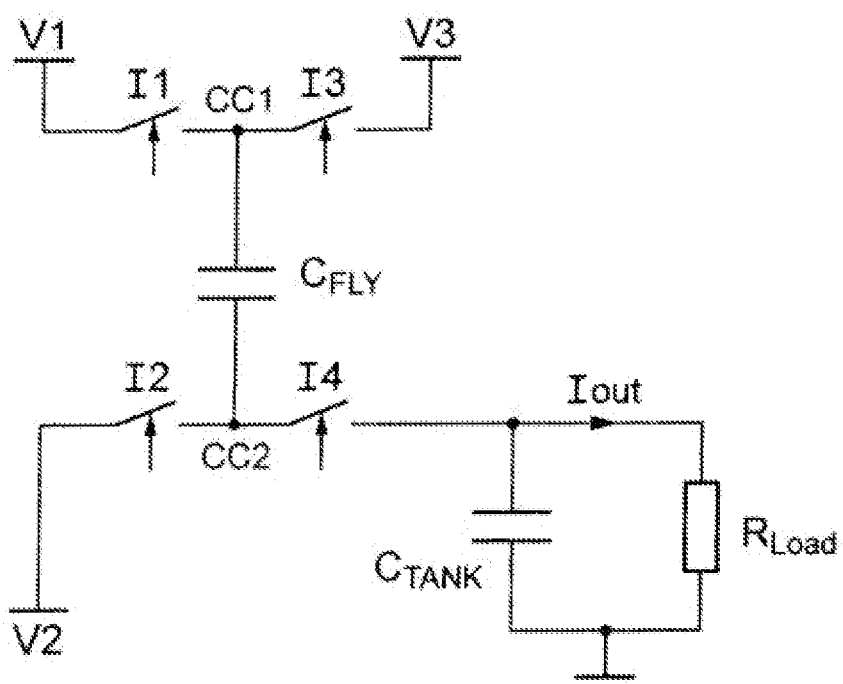
in FIG. 2: the schematic diagram of a charge pump circuit with pulse width modulation.

FIG. 2 is a schematic diagram of the operating principles of a charge pump circuit as used in a voltage regulator.

A flying capacitor $C_{FLY}$ is arranged in a bridge with four controlled switches I1, I2, I3 and I4. More particularly, a first plate CC1 of the capacitor $C_{FLY}$ is brought to the potential of a voltage V1 through a controlled switch I1, and to the potential of a voltage V3 through a controlled switch I3. The other plate CC2 of the capacitor $C_{FLY}$ is brought to the potential of a voltage V2 through a controlled switch I2, and to the potential of a voltage V4 through a controlled switch I4 and a charge storage capacitor or reservoir capacitor $C_{TANK}$. A load, symbolized here by an impedance $R_{Load}$, is connected in parallel to the terminals of the capacitor $C_{TANK}$.

The operation of the charge pump is as follows.

In a first phase of operation (phase 1), the switches I1 and I2 are closed and the switches I3 and I4 are open. The capacitor $C_{FLY}$ is charged to a voltage corresponding to the difference between the potentials of V1 and V2. In a second phase of operation (phase 2), it is the reverse. The switches I1 and I2 are open and the switches I3 and I4 are closed. The capacitor $C_{FLY}$ is then discharged between the potentials of the voltages V3 and V4, to the reservoir capacitor $C_{TANK}$ and to the load $R_{Load}$. The capacitors $C_{FLY}$ and $C_{TANK}$ are sized such that, also as a function of the current typically absorbed by the load $R_{Load}$, a majority of the charge accumulated in the capacitor $C_{FLY}$ in phase 1 is transferred into the capacitor $C_{TANK}$ in phase 2. In phase 1, the current absorbed by the load is provided by discharging the capacitor $C_{TANK}$. Phases 1 and 2 alternate.

The value of the potentials V1, V2, V3 and V4 depends on the requirements of the application, and in particular on the sign of the voltage that is to be generated at the terminals of the load $R_{Load}$.

The control signals for the switches I1, I2, I3 and I4 are generated with the aid of pulse-width modulation logic, with the fraction of the period of the pulse-width modulated signal in which switches I1 and I2 are closed corresponding to the duty cycle. This duty cycle is controlled as a function of the current Iout absorbed by the load $R_{Load}$, such that this current follows the profile corresponding to the requirements of the application. For example, the regulation can consist of delivering a current Iout of constant value.

Figure 3:
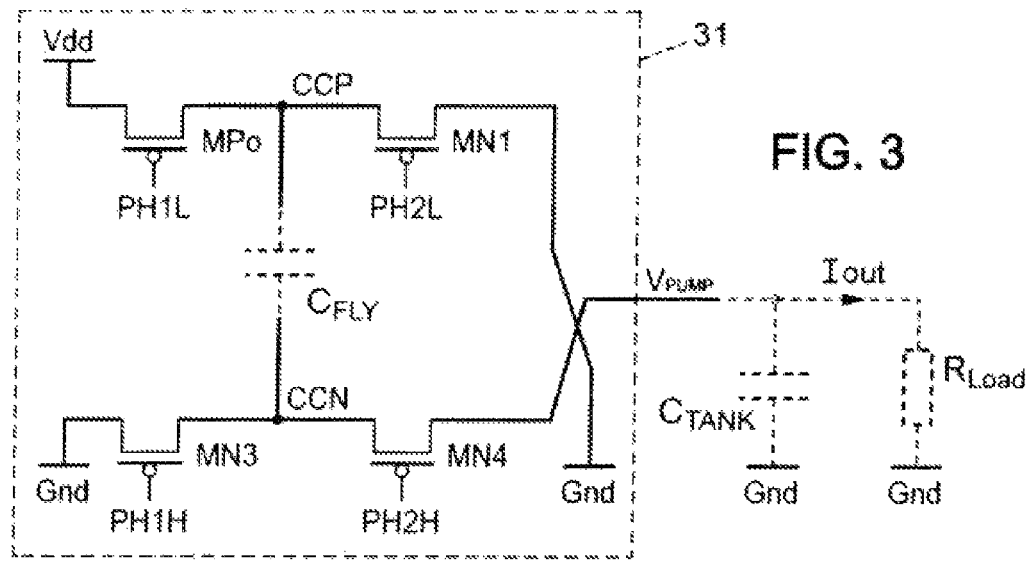
in FIG. 3: application of the principle of the circuit of FIG. 2, to generate a regulated negative supply voltage from a positive supply voltage.

The diagram in FIG. 3 shows an exemplary implementation of the charge pump circuit principle as described above, to generate a negative voltage $V_{PUMP}$. In this example, the voltage V1 corresponds to a supply voltage Vdd referenced relative to the potential of the voltage V2 which is the ground potential Gnd. The voltage V3 is the zero voltage, meaning that of the ground potential Gnd. The same is true for the voltage V4.

In the example considered here, the switch I1 is realized as a PMOS transistor denoted as MPo. The switches I2, I3 and I4 are realized as NMOS transistors respectively denoted as MN3, MN1, and MN4. These four transistors are large-sized MOS transistors, or "large" transistors. The transistor MPo is controlled by a logic signal PH1L. The transistor MN3 is controlled by a logic signal PH1H. The transistor MN1 is controlled by a logic signal PH2L. Lastly, the transistor MN4 is controlled by a logic signal PH2H. The signal PH1L is active in the low state, meaning that the transistor MPo is conductive (switch closed) when the signal PH1L is in the low logic state. The signals PH1H, PH2L, and PH2H, on the other hand, are active in the high state, meaning that the transistors MN3, MN1 and MN4 are in the conductive state (switch closed) when these signals are in the high logic state.

In one example, the three NMOS transistors are all the same size and their size is half that of the PMOS transistor. In fact, their gate length is equal to about 28 mm compared to about 56 mm for that of the PMOS transistor.

The bridge formed by the four transistors MPo, MN3, MN1 and MN4, and by the flying capacitor $C_{FLY}$, constitutes the power portion 31 of the charge pump circuit. The control logic portion, which generates the control signals for the transistors, is not represented here. This power portion can be implemented in silicon, and integrated into a system on chip (SoC), except for the flying capacitor $C_{FLY}$ which is generally an external component. This is why the capacitor $C_{FLY}$ is represented with dotted lines in FIG. 3. The same is true for the reservoir capacitor $C_{TANK}$, and the load impedance $R_{load}$.

The charge pump circuit in FIG. 3 demonstrates the disadvantages explained in the introduction, namely the existence of significant switching losses as determined by the relation (1) given above.

To remedy these disadvantages, it is proposed to associate another transistor with each of the large transistors in the transistor bridge, said other transistor being small in size and connected in parallel with said large transistor. In the following description, the expression "small transistor" refers to a small-sized transistor. This expression is further clarified below. In addition, the term "associated" used in reference to two transistors signifies that these two transistors are connected in parallel.

Thus a small PMOS transistor, denoted MPo', is associated with the large transistor MPo, and is controlled by a logic signal PH1L' independent of the signal PH1L. Similarly, a small transistor MN3' is connected in parallel with the large transistor MN3, and is controlled by a signal PH1H' independent of the signal PH1H. Equally similarly, the transistor MN1 is connected in parallel with a small transistor MN1', which is controlled by a signal PH2L' independent of the signal PH2L. Lastly, the transistor MN4 is connected in parallel with a small transistor MN4' controlled by a logic signal PH2H' independent of the signal PH2H.

Compared to the large transistors MPo, MN3, MN1 and MN4, the small transistors respectively associated with them, which are MPo', MN3', MN1' and MN4', are transistors with a substantially smaller gate length, for example 10 times smaller. For example, if all the transistors have a gate width equal to about 0.5 μm, the large PMOS transistor has a gate length of about 56 mm while the small PMOS transistor has a gate length of about 5.6 mm. One will also note that the three small NMOS transistors have a gate length that is for example 10 times less than that of the large NMOS transistors, meaning about two times smaller than that of the small PMOS transistor, which is about 2.8 mm.

Advantageously, the small transistors are, in their silicon implementation, integrated with the associated large transistor. In fact, as is usual, a large MOS transistor is conventionally implemented by a plurality of smaller MOS transistors connected in parallel and controlled in common. Here, the small transistors are therefore integrated with the large transistors from the point of view of their silicon implementation, but they are independently controlled by the control signals associated with them. In other words, the small MOS transistors can be controlled separately from the large MOS transistors. This arrangement provides the advantage that the power module 41 in FIG. 4, which comprises the bridge of large transistors and their associated small transistors, requires little more space than the power module 31 in FIG. 3. The additional surface area, which is slight, essentially originates from the connections enabling independent control of the small MOS transistors. The total surface area occupied by the power module 41 is on the order of 0.056 mm².

As was already indicated above with reference to the diagram in FIG. 2, the charge pump circuit operates in two alternating modes of operation, called phase 1 and phase 2 in the present description.

Figure 4:
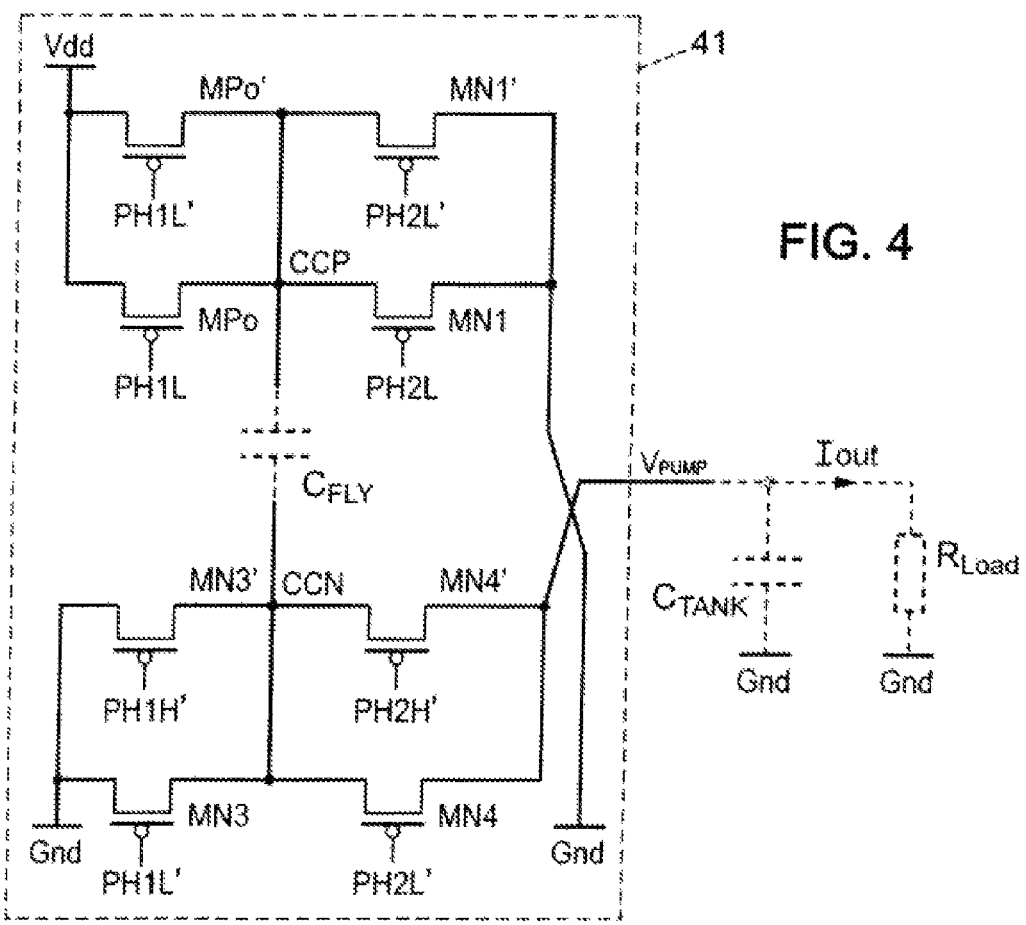
in FIG. 4: a diagram illustrating an embodiment of the invention, applied to the circuit of FIG. 3.

In addition, the circuit in FIG. 4 operates in two modes of operation, as a function of the intensity of the current Iout that is output from the regulator. In the first mode of operation, only the small MOS transistors are switched. In the second mode of operation, it is the large MOS transistors which are switched, alone or in combination with the small MOS transistors respectively associated with them (particularly in the case where the small transistors are integrated with the large transistors).

The passage from the first mode of operation to the second mode of operation depends on the value of the output current Iout from the regulator which is absorbed by the load $R_{LOAD}$. A means for measuring the current Iout can be provided, generating a measurement of this current which will be provided as input to a control logic adapted to generate the control signals for the small MOS transistors and the large MOS transistors.

We will now describe an advantageous and more elegant solution, inspired by the known solution for a charge pump with pulse-width modulation using pulse skipping.

Figure 5:
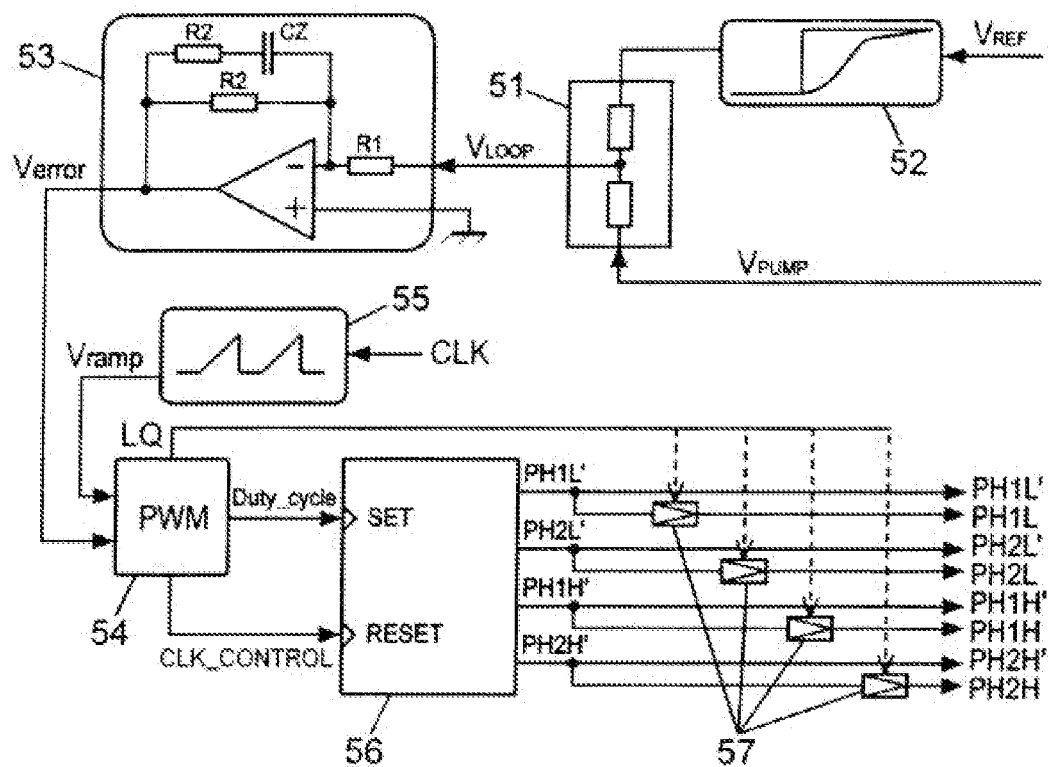
in FIG. 5: a functional diagram showing means for controlling the charge pump circuit of FIG. 4.

In FIG. 5, a control module for the power circuit in FIG. 4 is represented in an advantageous embodiment.

As we will now see, this solution has the advantage that the passage from one mode of operation to the other is automatic.

This control module comprises a logic which directs the switching of the large MOS transistors and small MOS transistors based on the voltage $V_{PUMP}$ at the terminals of the load $R_{LOAD}$.

The module firstly comprises a comparator 51 comprising an input for receiving the voltage $V_{PUMP}$ and another input for receiving a reference voltage $V_{REF}$ through a power-on trigger 52, as well as an output generating a voltage $V_{LOOP}$.

The comparator 51 is for example a bridge of resistors in series, receiving the voltage $V_{PUMP}$ and the voltage $V_{REF}$ at each of its two terminals. The voltage $V_{LOOP}$ is for example taken at the midpoint between two resistors in series forming such a resistive bridge. The voltage $V_{LOOP}$ is therefore equal to the difference between the voltages $V_{REF}$ and $V_{PUMP}$ weighted by the respective values of the two resistances of the resistive bridge. This is therefore a voltage which corresponds to a weighted error for the value of $V_{PUMP}$ compared to the value of $V_{REF}$. When the two resistances of the resistive bridge 51 are equal, this is the direct difference between these two voltages. Other embodiments of the comparator 51 can be considered, particularly an active comparator. The embodiment in the form of a resistive bridge seems to be the simplest embodiment for comparing the voltages $V_{PUMP}$ and $V_{REF}$, however.

The function of the circuit 52 is to render the slope of the voltage $V_{REF}$ more vertical when the circuit is powered on. This module is not indispensable.

The circuit 52 allows slowly increasing the reference voltage at startup from 0V to $V_{REF}$ to limit spikes of current during startup in order to avoid stressing the power MOS.

The control module next comprises an error amplifier 53, which receives the voltage $V_{LOOP}$ as input and generates an error voltage Verror as output. In the example represented, the amplifier 53 has the structure of an integrating amplifier. Other exemplary embodiments can of course be envisaged; this one is provided solely as a non-limiting illustration.

The control module also comprises a pulse-width modulator 54 which receives the error voltage Verror on a first input and a sawtooth voltage Vramp on a second input. The voltage Vramp is produced by a sawtooth voltage generator 55. This generates a sawtooth voltage of a frequency corresponding for example to the frequency of a clock signal CLK. In the following description and in the figures, the minimum and maximum values of the signal Vramp are respectively denoted as "Vramp_min" and "Vramp_max".

The modulator 54 generates a periodic rectangular waveform signal Duty_cycle that is pulse-width modulated as a function of the comparison between the voltages Verror and Vramp. This signal Duty_cycle is furnished as an input "SET" to a combinational logic block 56. The block 56 also comprises an input "RESET" for resetting these combinational circuits to zero, which is activated by the rising edges of a signal CLK_control, which presents pulses of the same frequency as that of the clock signal CLK. Ton denotes the fraction of a width-modulated control pulse of the signal Duty_cycle during which the signal is active in the high state. The duty cycle is therefore given by Ton/T, where T designates the period of the signal Duty_cycle and clock signal CLK.

The block 56 generates the switching signals PH1L', PH2L', PH1H' and PH2H' for the small MOS transistors of the bridge of the power module in FIG. 4. The signals PH1L, PH2L, PH1H and PH2H are respectively generated from the signals mentioned above, with the aid of pass-gates collectively labeled as 57.

The operation of the control module of FIG. 5 will now be described.

The pass-gates 57 are controlled by a signal LQ generated by the modulator 54. When LQ is equal to 1, the gates 57 do not pass signals. When LQ is equal to 0, the gates 57 pass signals. In other words, the condition LQ=1 corresponds to the first mode of operation while the condition LQ=0 corresponds to the second mode of operation.

In the first mode of operation (LQ=1), only the small MOS transistors are switched by the alternating phases of operation 1 and 2. The switching losses are then very low, as the gate-source capacitance Cgs of these small transistors is low (according to the relation (1) give above). In the second mode of operation (LQ=0), the large MOS transistors are switched instead of or in addition to the small MOS transistors in the first mode of operation. Greater charge pumping is obtained and ultimately an output voltage $V_{PUMP}$ which is maintained in spite of the load absorbed by the output current Iout.

Figure 6:
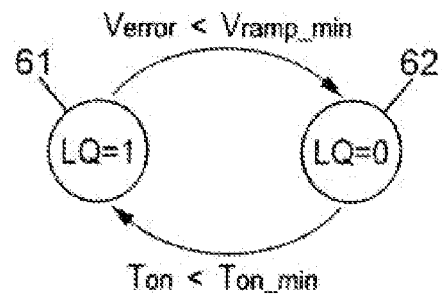
in FIG. 6: a state diagram illustrating the modes of operation of the charge pump circuit of FIG. 4.

The state diagram in FIG. 6 illustrates the automatic passage from a state 61 corresponding to the first mode of operation (LQ=1) to a state 62 corresponding to the second mode of operation (LQ=0), and vice versa. It begins in the state 61 and passes to the state 62 when the voltage Verror is less than the voltage Vramp_min. Conversely, it passes from the state 62 to the state 61 when the duty cycle Ton is less than a value Ton_min of the duty cycle which is considered to be the minimum admissible value.

Figure 7:
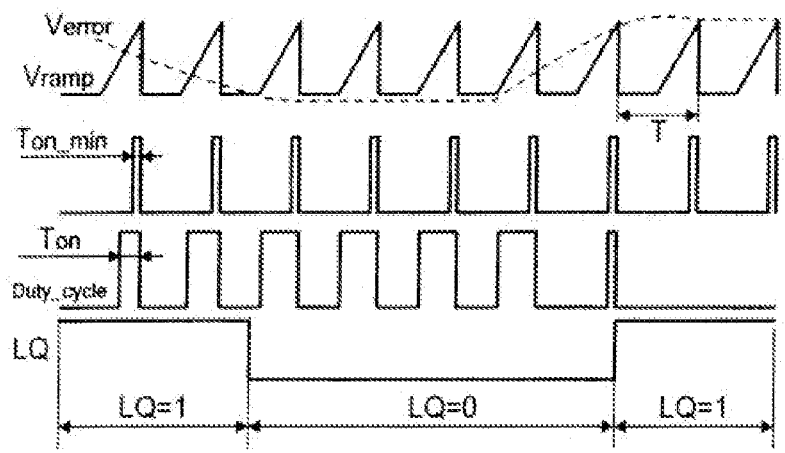
in FIG. 7: a timing chart illustrating the operation of the circuit of FIG. 3.

The illustration of these different conditions is given by the timing chart in FIG. 7. The top row in the chart represents the voltage Vramp, which is a periodic sawtooth voltage with a period T corresponding to the period of the clock signal CLK. The dotted curve represents the error voltage Verror, which in the Figure is superimposed on the voltage Vramp.

The duty cycle Ton of the signal Duty_Cycle is given, at each period, by the width of the sawtooth portion of the voltage Vramp which is situated above the voltage Verror, between the minimum value Ton_min and a maximum value which corresponds to T/2.

The second row in the timing chart in FIG. 7 illustrates what the signal Duty_Cycle would be if the duty cycle still had the minimum value corresponding to Ton_min.

The third row from the top in the timing chart shows the appearance of the signal Duty_Cycle if the error voltage Verror is as represented in the first row at the top of FIG. 7.

The fourth row in the timing chart (the bottom entry) shows the logic level of the signal LQ controlling the mode of operation of the control module. Assuming an initial state in which LQ=1 (state 61), the signal LQ passes to zero (state 62, LQ=0) when the voltage Verror is less than the voltage Vramp_min. The duty cycle Ton is then at its maximum value, equal to T/2, such that it is no longer possible to increase the voltage $V_{PUMP}$ by increasing the duty cycle Ton. By passing to the second mode of operation, the contribution of the large MOS transistors in the power module of the voltage regulator $V_{PUMP}$ is obtained. In the second mode of operation (state 62, LQ=0), when the duty cycle Ton/T of the signal Duty_Cycle decreases to the point where it reaches the minimum value Ton_min/T, the control signal LQ goes back to 1. One then returns to the first mode of operation (state 61, LQ=1).

Figure 8:
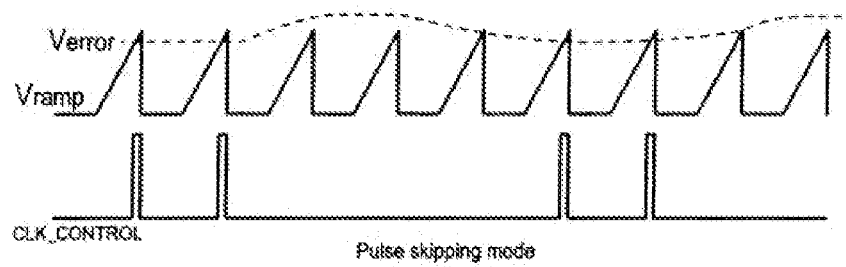
in FIG. 8: another timing chart illustrating the pulse skipping which can be applied to the circuit of FIG. 3.

The timing chart in FIG. 8 illustrates the implementation of the pulse skipping functionality, which is advantageously compatible with the implementation of embodiments of the invention as described above.

In fact, this functionality can be implemented when the error voltage Verror is greater than the voltage Vramp_max, which corresponds to the case where so little current Iout is absorbed by the load that the voltage $V_{PUMP}$ becomes too high. Management of this functionality can advantageously be assured by the modulator 54 (FIG. 5) which generates the signal CLK_Control activating the combinational logic block 56. The clock pulses of the signal CLK_Control are spaced apart by the same period T as the period of the clock signal CLK. However, when the condition "Verror>Vramp_max" is met, the signal CLK_Control does not present these pulses. In other words, pulses are skipped in the transistor control signals generated by the block 56 and the pass-gates 57 by skipping clock pulses of the signal CLK_Control.

Figure 1:
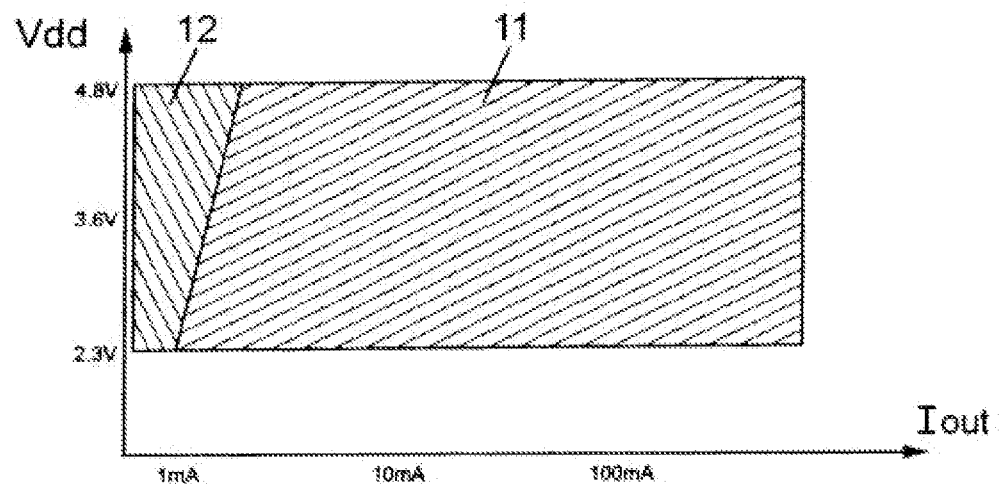
in FIG. 1, already discussed: a graph illustrating the operating region within which pulses can be skipped in order to limit switching loss.
Figure 9:
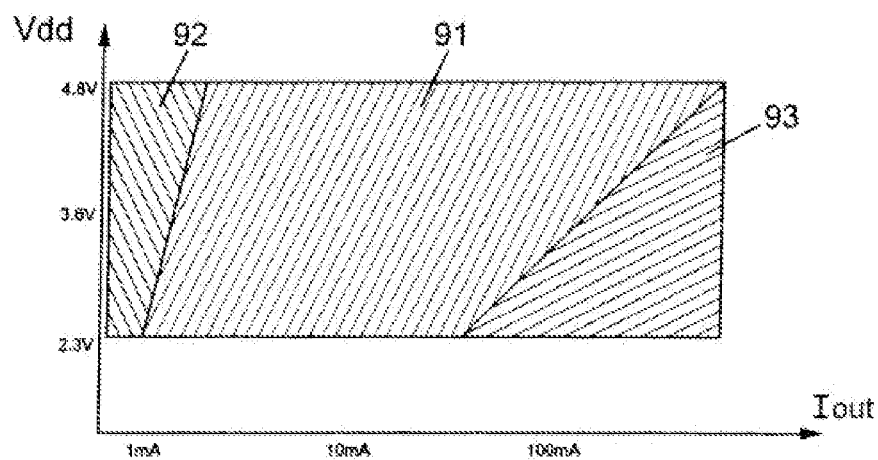
in FIG. 9: a diagram illustrating the operating ranges of the circuit in the first and second modes of operation, as well as the operating region in which pulse skipping can be applied.

FIG. 9, provided for comparison with FIG. 1, shows a graph of the voltage regulator operating range for a regulator implementing embodiments of the invention as described above.

The operating range comprises a central region 91 corresponding to the first mode of operation of the regulator (LQ=1). This operating region corresponds to all values of the output current Iout up to several dozen milliamps when the voltage Vdd is on the order of 2.3 V. It also extends to several hundred milliamps, possibly to the highest possible values of the current Iout, when Vdd is on the order of 4.8 V. The region 92 is situated within the region 91. The pulse-skipping functionality can be implemented within this region 92. This region corresponds to the region 12 which was described in the introduction with reference to FIG. 1. Within the operating region 91 (and therefore within the region 92 which is comprised within the region 91), the charge pump circuit operates by switching small MOS transistors only.

The operating range of the regulator also comprises a region 93 corresponding to the operation of the regulator in the second mode of operation (LQ=0). Within this region 93, the charge pump circuit operates by switching large MOS transistors instead or in addition to small MOS transistors. This operating region corresponds to a current Iout of a few dozen milliamps when Vdd is substantially equal to 2.3 V, or higher values for greater values of the supply voltage Vdd.

Advantageously, when the voltage regulator operates within the region 91, switching loss is greatly reduced compared to operation within the region 93.

More generally, the graph in FIG. 8 clearly illustrates the advantages of the invention, considering the relation (1) given in the introduction which defines the switching losses of the charge pump circuit. More particularly:

when the circuit is within the operating region 93, the large MOS transistors are used which have the advantage of having a high parasitic gate-source capacitance Cgs, but the circuit is in this mode of operation for relatively low values of the voltage Vdd such that the value of P remains minor;

when the circuit is within the operating region 91, the charge pump circuit operates with the aid of small MOS transistors only, which have a low capacitance Cgs such that P remains low; and, in embodiments in which pulse skipping is implemented, and when the circuit is within the operating region 92, not only are only the small MOS transistors used with a low capacitance Cgs, but in addition the switching frequency F is reduced such that P is even lower.

In other words, the regulator only operates within the region 93, which is the least advantageous region, in cases when such operation is strictly necessary to ensure the value of the voltage $V_{PUMP}$ is maintained for the higher current Iout absorbed by the load. This mode of operation is also characterized by relatively low values for the supply voltage Vdd.

Figure 10:
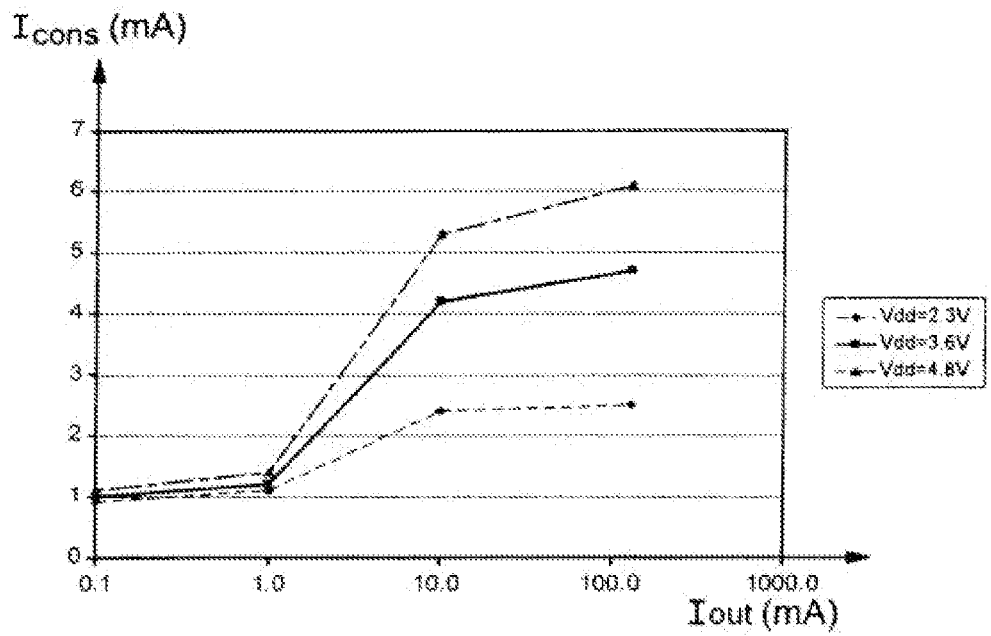
in FIG. 10 and FIG. 11: respective curves showing the current consumed in the charge pump circuit as a function of the circuit current consumed by the load for different values of the circuit supply voltage, for a circuit not implementing the invention and for a circuit implementing it.
Figure 11:
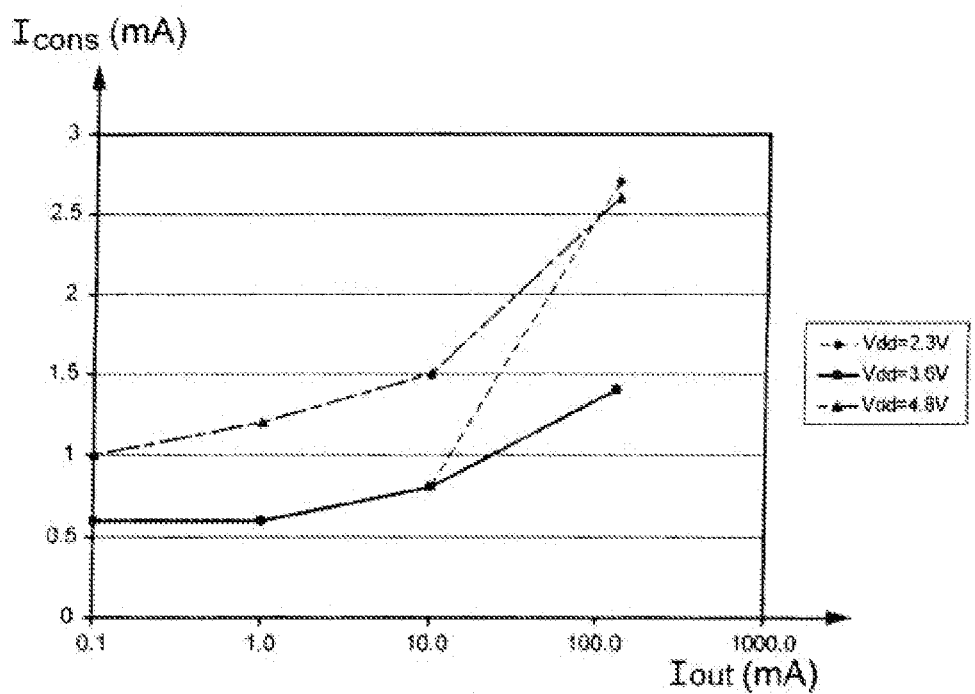

The graphs in FIGS. 10 and 11 show the value of the current Icons that is consumed by the charge pump circuit for three values of the supply voltage: 2.3 V, 3.6 V, and 4.8 V. FIG. 10 corresponds to a charge pump circuit according to FIG. 3, which does not implement embodiments of the invention. FIG. 11 corresponds to a charge pump circuit according to FIG. 4 and FIG. 5, which implements embodiments of the invention.

As one can see by comparing these two Figures, the implementation of embodiments of the invention decreases the current Icons for all voltages Vdd. This decrease corresponds to a reduction of about 50%, except for high values of the current Iout at a low supply voltage Vdd (which corresponds to points in which the circuit operates in the same manner as circuits of the prior art, as will have been understood).

Figure 12:
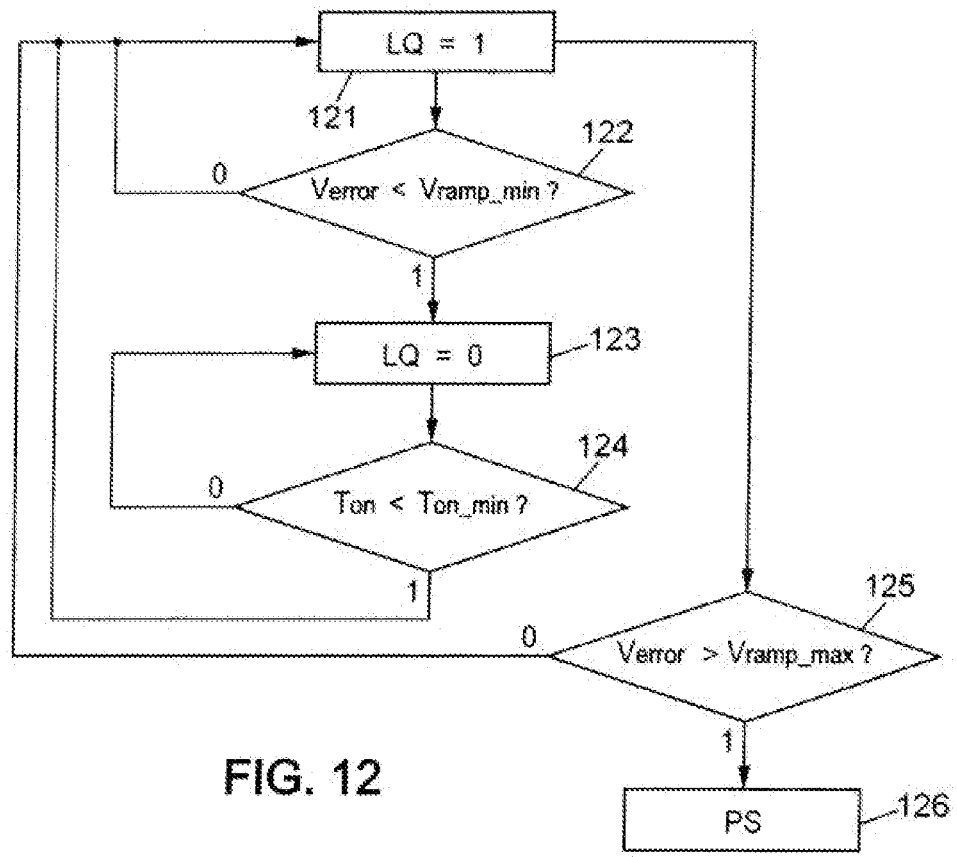
in FIG. 12: the functional diagram of a device according to the second aspect of the invention; and,
in FIG. 13: a diagram of the steps in an embodiment of a process according to the third aspect of the invention.

The steps of a process according to the second aspect are illustrated by the diagram in FIG. 12.

In a step 121, the charge pump circuit operates in the first mode (state corresponding to LQ=1, in which only the small MOS transistors are switched).

If, in a test step 122, it is determined that the error voltage Verror is less than the value Vramp_min of the sawtooth voltage Vramp (case symbolized by the logic value 1 in the figure), then in a step 123 the circuit passes to the second mode of operation (state corresponding to LQ=0, in which the large MOS transistors are switched, either alone or with the small MOS transistors). Otherwise (case symbolized by the logic value 0 in the figure), it remains in the state LQ=1 and returns to the step 121.

If, when the circuit is in the state LQ=0, it is determined in a test step 124 that the duty cycle has reached its minimum value (in other words Ton is equal to Ton_min), then the circuit returns to the state corresponding to LQ=1 and the process returns to the step 121. Otherwise the circuit remains in the state corresponding to LQ=0 and the process returns to step 123.

If, when the circuit is in the state LQ=1, it is determined in a test step 125 that the error voltage Verror is greater than the value Vramp_max of the sawtooth voltage Vramp, then the pulse skipping functionality is implemented in a step 126 (symbolized by "PS").

Figure 13:
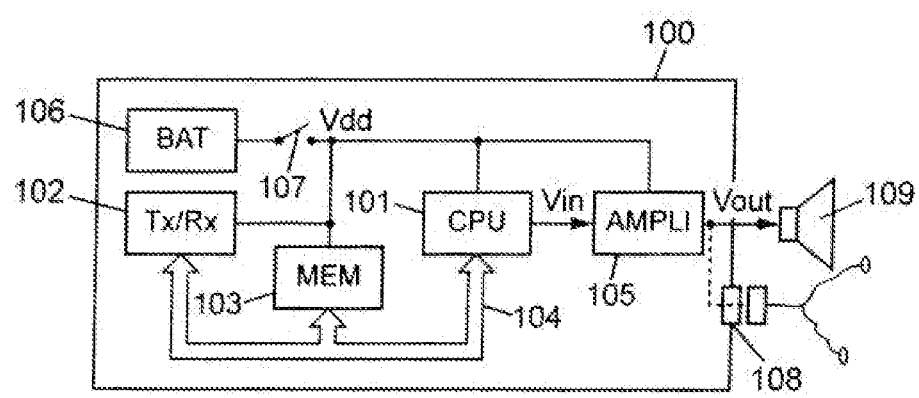

The block diagram in FIG. 13 shows the elements of a device incorporating an audio amplifier as presented above. Such a device can be a mobile telephone or any other device which posses an audio reproduction function, whether or not the device is for communication.

The device 100 comprises a control unit 101 such as a processor (CPU), and a communication unit 102 for transmitting and receiving information to and from the outside, in particular by modulating a radio frequency carrier. It also comprises a memory 103 which can store information in digital form, for example a piece of music. The processor 101 communicates with the unit 102 and the memory 103 via a communication bus 104. Each of these elements is powered by the supply voltage Vdd delivered by a battery 106 through a control switch 107. When powered on, this switch 107 is closed.

The processor 101 generates an audio signal Vin to be amplified, based on data either received via the unit 102 or read from the memory 103.

To amplify this signal Vin, the device 100 comprises an audio amplification circuit 105. This circuit 105 is powered by the voltage Vdd applied to it through the switch 107 when turned on, and comprises a voltage regulator for which embodiments have been described above, for regulating this supply voltage.

For example, the audio amp is supplied positive voltage by the battery or a switched-mode power supply (SMPS), and negative voltage by the charge pump circuit of FIG. 4 generating a negative voltage, which itself is powered either directly by the battery or by the SMPS. In the second case the SMPS has the advantage of increasing the total yield of the audio block.

The positive and negative voltage supplied to the audio amp allows maintaining audio performance even at very low battery power (about 2.3V). This also allows eliminating the capacitor external to the SoC between the audio amplifier and the speaker, and therefore lowers the size and costs of the circuit.

The output signal Vout generated by the amplification circuit 105 drives a speaker 109, which can be internal to the circuit 100 or external. Additionally or alternatively, it can also drive a headset jack 108 of the device 100, to allow the user to listen using a headset or earphones.

The invention has been described above with reference to certain embodiments. It is understood, of course, that any technically conceivable variation falls within the context of the present application.

The invention claimed is:

1. Voltage regulator comprising a charge pump circuit with pulse width control and having:
   an output for delivering an output voltage to a load;
   a flying capacitor;
   a charge storage capacitor coupled in parallel to the output;
   a control logic;
   switching elements arranged and controlled by the control logic to charge the flying capacitor in a first phase of operation, and to transfer the electrical charges stored in the flying capacitor to the storage capacitor in a second phase of operation,
   an error signal generator generating an error signal corresponding to the difference between the output voltage from the regulator and a reference voltage;
   a sawtooth wave signal generator generating a sawtooth wave signal; and
   a pulse width modulator comparing the error signal and the sawtooth wave signal, and generating switching signals for the switching elements,
   wherein:
   each switching element comprises a relatively small-sized MOS transistor associated with a relatively large-sized MOS transistor connected in parallel and controlled separately;
   only the relatively small-sized transistors are switched in a first mode of operation, while the relatively large-sized transistors are switched in a second mode operation; and
   the control logic is configured to cause the regulator to pass from the first mode of operation to the second mode of operation when the error signal is less than a minimum value for the sawtooth wave signal.

2. Voltage regulator according to claim 1, wherein the control logic is additionally configured to implement a pulse skipping functionality applied to the switching signals when the error signal is greater than a maximum value of the sawtooth wave signal.

3. Voltage regulator according to claim 1, wherein the small-sized MOS transistors are respectively integrated with the large-sized MOS transistors with which they are associated, and wherein, in the second mode of operation, the large-sized MOS transistors are switched simultaneously with the small-sized MOS transistors with which they are respectively associated.

4. Electronic device comprising a voltage regulator according to claim 1.

5. Voltage regulation method using a charge pump circuit with pulse-width control and having:
   an output for delivering an output voltage to a load;
   a flying capacitor;
   a charge storage capacitor coupled in parallel to the output;
   a control logic; and
   switching elements arranged and controlled by the control logic to charge the flying capacitor in a first phase of operation, and to transfer the electrical charges stored in the flying capacitor to the storage capacitor in a second phase of operation,
   each switching element comprising a relatively small-sized MOS transistor associated with a relatively large-sized MOS transistor, connected in parallel and controlled separately,
   the method comprising:
   generating an error signal corresponding to the difference between the output voltage from the regulator and a reference voltage;
   generating a sawtooth wave signal;
   comparing the error signal and the sawtooth wave signal using a pulse width modulator, and generating switching signals for the switching elements such that, only the relatively small-sized transistors are switched in a first mode of operation while the relatively large-sized transistors are switched in a second mode of operation; and
   passing from the first mode of operation to the second mode of operation when an error signal corresponding to the difference between the output voltage and the reference voltage is less than a minimum value of the sawtooth signal.

6. Method according to claim 5, wherein, in addition, a pulse skipping functionality applied to control signals of switching elements is implemented when the error signal is greater than a maximum value of the sawtooth signal.

7. Method according to claim 5, wherein, as the small-sized MOS transistors are respectively integrated with the large-sized MOS transistors with which they are associated, the large-sized MOS transistors are switched simultaneously with the small-sized MOS transistors with they are respectively associated, in the second mode of operation.

* * * * *